United States Patent

Yoshioka et al.

[11] Patent Number: 5,989,654
[45] Date of Patent: Nov. 23, 1999

[54] METHOD FOR MANUFACTURING AN OPTICAL INFORMATION RECORDING MEDIUM

[75] Inventors: Kazumi Yoshioka, Kyoto; Eiji Ohno, Osaka; Hidemi Isomura, Osaka; Hiroyuki Ohta, Osaka, all of Japan

[73] Assignee: Matsushita Electric Industrial Co., Ltd., Osaka, Japan

[21] Appl. No.: 08/888,867

[22] Filed: Jul. 7, 1997

[30] Foreign Application Priority Data

Jul. 8, 1996 [JP] Japan ..................... 8-177668

[51] Int. Cl.⁶ ..................................... H05H 1/24
[52] U.S. Cl. .................. 427/579; 118/50.1; 118/695; 118/723 E; 118/723 VE; 204/192.26; 427/162; 427/255.1; 427/255.3; 427/294; 427/569; 427/576; 427/580
[58] Field of Search ................... 427/569, 579, 427/576, 580, 162, 255.1, 255.3, 294; 118/695, 723 VE, 723 E, 50.1; 204/192.26

[56] References Cited

U.S. PATENT DOCUMENTS

| | | |
|---|---|---|
| 4,337,768 | 7/1982 | Hatada et al. ............... 128/124 D |
| 5,013,594 | 5/1991 | Mizumura et al. . |
| 5,020,048 | 5/1991 | Arai et al. . |
| 5,468,560 | 11/1995 | McPherson et al. ............... 428/413 |
| 5,586,110 | 12/1996 | Nakaki . |
| 5,609,290 | 3/1997 | Bobbio et al. ............... 228/206 |

FOREIGN PATENT DOCUMENTS 1-22488  5/1989  Japan .

OTHER PUBLICATIONS

Akira Kinbara, "Basic Technology of Thin Film", pp. 53–56. (English Translation) (No date avail.).

*Primary Examiner*—Bernard Pianalto
*Attorney, Agent, or Firm*—Merchant & Gould P.C.

[57] ABSTRACT

A method for manufacturing an optical information recording medium which is usually stable and is not affected by the environmental condition and an apparatus used therefor. The method comprises the steps of placing a substrate and a member comprising a material for a film opposing each other in a vacuum film forming chamber; forming a plasma by glow discharging a gas between the substrate and the member comprising a material for a film; and supplying a gas mixture containing water to the film forming chamber before forming films or during forming films of the protective layer by the film forming method in which the material for a film freed from the member comprising a material for a film by using the plasma as an energy source are attached or deposited on the substrate.

9 Claims, 8 Drawing Sheets

5,989,654

METHOD FOR MANUFACTURING AN OPTICAL INFORMATION RECORDING MEDIUM

FIELD OF THE INVENTION

The present invention generally relates to a method for manufacturing an optical information recording medium and a film forming apparatus used therefor. More particularly, it relates to a method for manufacturing a recording information medium which can exhibit the overwrite cycle property which is always stable and not affected by the environment at the time of manufacturing and to a film forming apparatus used therefor.

BACKGROUND OF THE INVENTION

Conventionally, a sputtering method has been used as one of the methods for manufacturing thin films. The basic structure of the sputtering apparatus used for such sputtering method is described in "Basic Technology of Thin Film" (written by Akira Kinbara, published by Hideo Tanaka, printed by the Tokyo University Publishing Foundation, 1985. 5. 20, Vol. 8, pages 53 to 56).

As shown in FIG. 5, in this apparatus, a cathode 2 and an anode 3 are provided in a vacuum film forming chamber 1; a target member 4 is attached to the cathode 2 and a substrate 5 is attached to the anode 3; and the predetermined amount of gas is introduced into the vacuum chamber 1 via a gas bomb (a gas cylinder) 6, a mass flow controller 7 and a pressure controlling valve 8. In this state, glow discharge is conducted by applying voltage between the cathode 2 and the anode 3; and a material for a film, which is sputtered from the target member 4 by using plasma generated by the glow discharge as an energy source, are deposited onto the substrate 5. These sputtering apparatus are divided into two types: a direct current (DC) type sputtering apparatus in which direct current is used for the power source, and a radio frequency (RF) type sputtering apparatus in which radio frequency is used for the power source. Moreover, in order to obtain high density plasma, a magnetic field convergence (magnetron discharge) type apparatus is used. In this magnetic field convergence type apparatus, electron released from a cathode does not go directly to an anode but is trapped in a space having both electric field and magnetic field which are crossing at right angle each other. By such structure, high density plasma can be provided and the efficiency of forming films can be enhanced.

In recent years, magnetron discharge type sputtering apparatus have been combined with direct current type or radio frequency type apparatus. The direct current type apparatus permits sputtering dielectric materials, and the radio frequency type apparatus permits sputtering both insulating materials and conductive materials. Which apparatus to be used is determined depending upon target members to be sputtered.

The above mentioned sputtering method is used for forming each layer of an optical disc. In general, a direct current (DC) magnetron discharge type apparatus is used for forming a recording thin film and a reflecting layer of an optical disc. Radio frequency (RF) magnetron discharge type apparatus may be used for forming the protective layer comprising insulating materials. At present, rewritable optical discs such as a magneto-optical disc, a phase change optical disc or the like, have been developed and put into practical use. The basic structure of these optical discs includes a first protective layer, a recording thin film, a second protective layer and a reflecting layer which are sequentially formed on a transparent substrate which comprises guide grooves for laser beams. In general, an overcoat layer comprising UV-ray curing resins is provided on the reflecting layer to prevent films from being damaged. In the above mentioned phase change optical disc, recording is conducted by making the recording film amorphous by heating a recording film to a temperature which is not less than the melting point and then quenching the recording film. Erasing is conducted by crystallizing the recording film by heating the recording film to a temperature which is not less than crystallization temperature nor more than melting point and then cooling slowly thereof. Signals are obtained by the difference in reflectance between the amorphous state and the crystalline state.

With phase change optical disc, where a Ge—Sb—Te type chalcogen compound is used for a recording film, the melting point is not less than 600° C. Thus, the protective film provided on both sides of the recording film is subjected to a thermal stress every time recording and erasing are conducted. Therefore, to provide a protective layer, a thermally stable film which has excellent adhesion to the recording thin film and having a strong mechanical strength is required. One protective layer which satisfies this conditions is a protective layer comprising a mixture of ZnS and $SiO_2$. However, even if films are formed by the use of a mixture of ZnS and $SiO_2$, the properties of the protective layer may change due to process conditions. For example, the environment for storing the substrate, exhausting time or the like may affect the properties of the overwrite cycle of recording and erasing an optical disc, which is manufactured through the step of forming film protective layer. In particular, the difference is made in the number of overwritable cycles between discs manufactured in high humidity and discs manufactured in low humidity. The discs manufactured in low humidity do not have the stable overwrite cycle property.

The object of the present invention is to solve the above mentioned problems and to provide a method for manufacturing an optical recording medium which is usually stable and is not affected by environmental conditions such as humidity condition and to provide a film forming apparatus used therefor.

SUMMARY OF THE INVENTION

The present inventors have sought to attain the above mentioned object and found out that the optical recording medium having an excellent overwrite cycle properties has a great deal of oxygen composition containing hydroxyl groups (—OH) in the mixture of ZnS and $SiO_2$ of one of the protective layers. On the other hand, the optical recording medium having an inferior overwrite cycle property has little oxygen composition containing hydroxyl groups (—OH) in the mixture of ZnS and $SiO_2$ of one of the protective layer, thereby achieving the method for manufacturing an optical recording medium of the present invention. This method will be explained as follows.

The method for manufacturing an optical recording medium of the present invention comprises the steps of: placing a substrate and a member comprising a material for a film opposing each other in a vacuum film forming chamber; forming a plasma by glow discharging a gas between the substrate and the member comprising a material for a film; and supplying a gas mixture containing water to the film forming chamber by the film forming method in which the materials for a film, which is freed from the member comprising a material for a film, by using the plasma as an energy source are attached or deposited on the substrate. In the method of the present invention, water is contained in the gas supplied to the above mentioned film forming chamber in the step of forming the protective layer. Herein, "a material for a film" denotes a plate-like product comprising a material to be formed into a film. The material for the film is generally called a target (member), when the method for forming films is a sputtering method or a laser sputtering method. The material for the film is generally called an evaporation source when the method for forming films is an ion plating method or an electron beam evaporation method. According to the above mentioned structure, a predetermined amount of hydroxyl groups (—OH) can be introduced into the protective layer without being effected by the manufacturing environment during film formation. As a result, an optical information recording medium having an excellent overwrite cycle property can be produced with a high reproducibility. The introduction of hydroxyl groups (—OH) into the protective layer enhances the overwrite cycle. This is unexpected. When the materials for protective layer are ZnS and $SiO_2$, it is thought that the oxygen atom (O) of hydroxyl group (—OH) links to zinc atom (Zn) of ZnS or oxygen atom (O) of $SiO^2$, and hydrogen atom (H) of hydroxyl group (—OH) links to silicon atom (Si) of $SiO_2$ forming a dangling bond. This improves the thermal and chemical stability, as well as the mechanical strength of the protective layer, and the adhesion to the recording thin film.

According to the present invention, it is preferable that the gas mixture contains water is a mixture of vaporized content of water and at least one gas selected from the group consisting of Ne, Ar, Kr and Xe. According to this structure, a more stable plasma by glow discharge may be formed, thus providing a protective layer which is excellent in the chemical and thermal stability, as well as mechanical strength and adhesion to the recording thin film.

It is preferable in the above mentioned method for manufacturing the optical information recording medium that the concentration of water ($H_2O$) in the gas mixture is from about 0.1 to 10 vol.%, which permits lengthening the life time of overwrite cycle.

It is preferable in the above mentioned method for manufacturing the optical information recording medium that the method for forming films is a sputtering method using a member comprising a material for a film as a sputter target.

It is preferable in the above mentioned method for manufacturing the optical information recording medium that the protective layer is formed by at least one dielectric material selected from the group consisting of $Al_2O_3$, $SiO_x$, $Ta_2O_5$, $MoO_3$, $WO_3$, ZnS, $ZrO_2$, $AlN_x$, BN, $SiN_x$, TiN, ZrN, $PbF_2$, $MgF_2$, and a mixture thereof.

According to the present invention, the film forming apparatus comprises a film forming chamber in which an anode to which the substrate is attached. The substrate and members are placed opposing each other. Also in the camber is a gas supply means supplying gas into a space within the film forming chamber, the gas being glow discharged by voltage applied between the anode and the cathode. The above mentioned gas supply means comprises a first gas supply path supplying a discharged gas containing no water to a film forming chamber. Each of the first and second gas supply path supplying gas containing water to the film forming chamber, each of the first and second gas supply paths have a gas flow controlling means which controls the flow rate of gas and a pressure controlling means. The apparatus of the present invention permits an accurate control of the concentration of water in the gas supplied into the film forming chamber and also makes the method for manufacturing an optical recording medium of the present invention more reasonably and stably.

It is preferable in the above mentioned film forming apparatus of the present invention that a gas supply means comprises a gas bomb filled with gas, a tank containing water, a first gas introducing tube having a first introducing tube section with which gas is introduced into the tank from the gas bomb and a second introducing section with which gas is introduced immediately into the film forming chamber from the gas bomb, a second gas introducing tube with which the gas mixture of the vaporized content of the water and the gas is introduced into the film forming chamber from the tank, and a gas flow controlling means equipped respectively to the second introducing tube section of the first gas introducing tube and to at least one section selected from the group consisting of the first introducing tube section of the first gas introducing tube and the second gas introducing tube. By such structure, the film forming apparatus permits an accurate control of the concentration of water in the gas supplied into the film forming chamber by means of a simple structure.

It is preferable in the above mentioned film forming apparatus of the present invention that an open part of the first introducing tube section of the first gas introducing tube is soaked in water, and gas released from the open part makes water in the tank bubble, thereby vaporizing water. This structure permits mixing water in gas reasonably and reliably.

It is preferable in the above mentioned apparatus of the present invention that an open part of the first introducing tube section of the first gas introducing tube is placed in a space of the tank and gas released from the open part is sprayed to water in the tank, thereby vaporizing the water. This structure permits mixing water in gas reasonably and reliably.

It is preferable in the above mentioned apparatus of the present invention that a heater is placed in the vicinity of the tank and the heater heats the tank, thereby vaporizing water in the tank. This structure permits mixing water into gas reasonably and reliably.

It is preferable in the above mentioned apparatus of the present invention that a heater for heating the second gas introducing tube and the gas flow controlling means equipped to the second gas introducing tube is provided. By such structure, in the second gas introducing tube, the water in gas can be prevented from forming dew, so that gas containing water can be supplied into the film forming chamber more stably.

It is preferable in the above mentioned apparatus of the present invention that a gas flow controlling means and a pressure controlling means are provided not in the second gas introducing tube but in the first introducing tube section of the first gas introducing tube. By such structure, a heater for preventing dewing is not required to be incorporated into a gas flow controlling means and pressure controlling means. Consequently, the structure of an apparatus for forming films become simple and gas can be supplied into film forming chamber stably.

According to the above mentioned structure, the method for forming the optical information recording medium comprises the steps: of placing a substrate and a member comprising a material for a film with opposing each other in a vacuum film forming chamber, forming a gas supplied to the film forming chamber into plasma by glow discharging between the substrate and the member comprising a material for a film and supplying a gas mixture containing water to the film forming chamber before or during forming the protective layer by the film forming method in which the material for a film, which is freed from the member comprising a material for a film, by using the plasma as an energy source are attached or deposited on the substrate. In this manufacturing method, during the step of forming the protective layer, water is contained in the gas supplied to the above mentioned film forming chamber, hydroxyl groups (-OH) are introduced into the protective layer regardless of the environmental condition at the time of forming films, thus resulting in the manufacture of an optical recording medium which is always excellent in the overwrite cycle property.

Furthermore, the film forming apparatus of the present invention comprises a film forming chamber in which an anode to which a substrate is attached and a cathode to which a member comprising a material for a film is attached are placed opposing each other and a gas supply means supplying gas into a space within the film forming chamber, and the gas being glow discharged by the use of voltage applied between the anode and the cathode. The gas supply means comprises a first gas supply path supplying discharged gas containing no water to a film forming chamber and a second gas supply path supplying gas containing water to the film forming chamber. Each of the first and second gas supply paths have a gas flow controlling means which controls the flow rate of gas and a pressure controlling means. By such structure, the above mentioned method for manufacturing an optical recording medium can be conducted reasonably and stably.

DETAILED DESCRIPTION OF THE INVENTION

Figure 1:
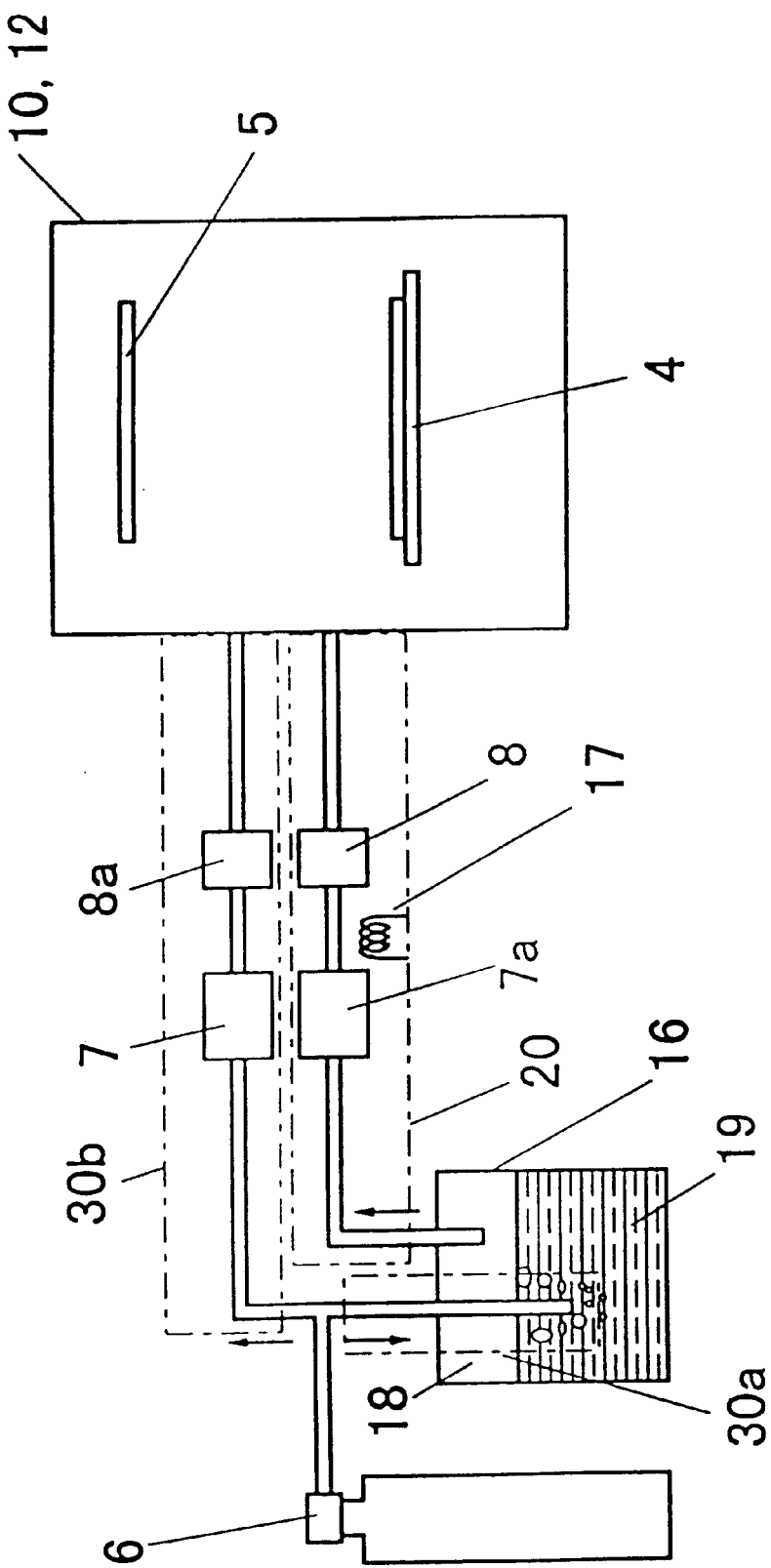
FIG. 1 is a schematic view showing a structure of an embodiment of the apparatus section for forming the protective layer, which comprises a film forming chamber for forming the protective layer and a gas supply apparatus supplying gas into the film forming chamber for forming the protective layer, in an in-line sputtering film forming apparatus used in the method for manufacturing the optical information recording medium of the present invention.

The present invention comprises a film forming method used for manufacturing an optical information medium including the steps of placing a substrate and a member comprising a material for a film opposing each other in a vacuum film forming chamber, forming a gas supplied to the film forming chamber into plasma by glow discharging between the substrate and the member comprising a material for a film, and supplying a gas mixture containing water to the film forming chamber by the film forming method in which the material for a film, which is freed from the member comprising a material for a film by using the plasma as an energy source, are attached or deposited on the substrate. Examples of the film forming methods include; a sputtering method, a laser sputtering method, an ion plating method, an electron beam evaporation method or the like. Among them, the sputtering method is preferably used from the viewpoint of an accuracy in controlling the film composition. Moreover, as a sputtering apparatus, that is, an apparatus for forming films by the sputtering method, a magnetron discharge type sputtering apparatus is preferably used.

The gas introduced into the above mentioned film forming chamber is, in general, at least one gas selected from the group consisting of Ne, Ar, Kr, Xe, and mixture thereof.

The supply of gas containing $H_2O$ (the vaporized content of water) into the film forming chamber in the step of forming the protective layer is appropriately determined according with the constituent materials of the protective layer or constituent materials of the recording thin film. In general, examples of members comprising a material for a film used in the step of forming the protective layer, include a member comprising one material or a plurality of materials selected from the group consisting of various kinds of dielectric materials such as $Al_2O_3$, $SiO_x$, $Ta_2O_5$, $MoO_3$, $WO_3$, ZnS, $ZrO_2$, $AlN_x$, BN, $SiN_x$, TiN, ZrN, $PbF_2$, $MgF_2$ or the like. Among the above, as the protective layer supplying gas containing $H_2O$ (the vaporized content of water) before or during the formation of films, a protective layer comprising an oxide which can easily uptake hydroxyl groups (—OH) is preferably used. In particular, a member comprising ZnS and $SiO_2$ is preferably used, since it is thermally stabile, highly adhesive to a recording thin film and high in the mechanical strength.

As a member comprising a material for a film used in the step of forming the recording thin film, a member comprising a chalcogen compound comprising chalcogen (an element of oxygen family) such as Te, Se or the like as a main component or a compound comprising In as a main component is generally used. Concrete examples of such a chalcogen compound or compound containing In include Te—Sb—Ge, Te—Ge, Te—Ge—Sn, Te—Ge—Sn—Au, Sb—Te, Sb—Se—Te, In—Te, In—Se, In—Se—Tl, In—Sb, In—Sb—Se, In—Se—Te or the like.

As a member comprising a material for a film used in the step of forming the reflecting layer, a member comprising a metal element selected from the group consisting of Au, Al, Ag, Ni, Fe, Cr or the like or alloy thereof is used.

Figure 4:
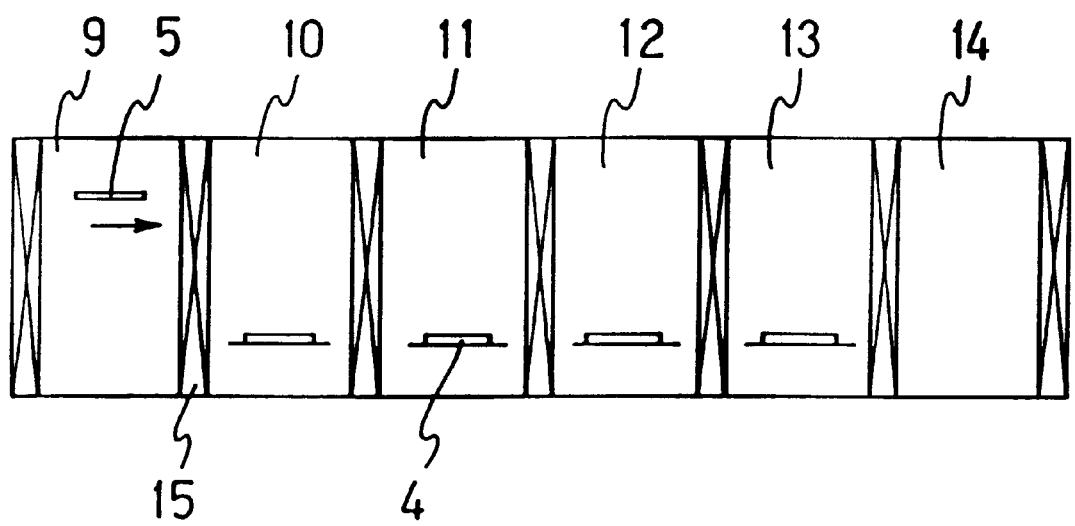
FIG. 4 is a schematic view showing a structure of an embodiment of the in-line sputtering film forming apparatus used in the method for manufacturing the optical information recording medium of the present invention.

FIG. 4 illustrates a schematic structure of one embodiment of an inline sputtering film forming apparatus used in the method for manufacturing an optical recording medium of the present invention. In FIG. 4, numeral 4 is a target member (a member comprising a material for a film), 5 is a substrate, 9 is a load lock chamber (hereinafter, an LL chamber will be used for abbreviation), 10 is a first film forming chamber for forming a protective layer, 11 is a film forming chamber for forming a recording thin film, 12 is a second film forming chamber for forming a protective layer, 13 is a film forming chamber for forming a reflecting layer and 14 is an unload lock chamber (hereinafter, a ULL chamber will be used for abbreviation). The LL chamber 9, film forming chambers 10–13 and ULL chamber 14 are linked via gate valves 15. In this figure, the structure of a gas supply apparatus which is necessary to an actual film forming operation in the film forming chambers 10–13 and which supplies gas into the film forming chambers 10–13 is omitted.

Hereinafter, the manufacturing step of a phase change optical disc using an in-line sputtering film forming apparatus will be explained. First, an entire manufacturing step will be roughly explained as follows. The substrate 5 molded by the injection method is carried by a substrate carrying means (not shown in this figure) and exhausted for the predetermined time. Then, the substrate 5 is carried to the first film forming chamber for forming the protective layer 10, the chamber for forming the protective thin film 11, the second chamber for forming the protective layer 12 and the film forming chamber for forming the reflecting layer 13, in that order. Film forming operation is conducted in each film forming chamber. In each chamber, the formation of films are conducted in the following steps: the substrate 5 and target member 4 are placed to be opposed each other; a glow discharge is conducted to the Ar gas for discharge; materials for a film sputtered from the target member 4 is deposited onto the substrate 5. Herein, the first protective layer is formed at the thickness of approximately 150 nm; the recording layer is at approximately 20 nm; the second protective layer is at approximately 40 nm; and the reflecting layer is at approximately 100 nm. At this time, the gate valve 15 linking each film forming chamber is being locked, so that the formation of films is conducted in each independent chamber. After such four layers are formed, the substrate 5 is carried to the ULL chamber 14. The ULL chamber is made to be at the state of atmospheric pressure and the substrate 5 on which the above mentioned four layers are formed are taken to the ULL chamber. Then, a UV-ray curing resin is applied onto the reflecting layer to form a setting resin layer, thus completing an optical information recording medium.

Next, the step of forming the protective layers (the first protective layer and the second protective layer) conducted in the first film forming chamber for forming the protective layer 10 and the second film forming chamber for forming the protective layer 12 will be explained in detail. In the step of forming the protective layers, a gas is introduced into the film forming chambers 10 and 12, such as Ar gas, containing water. FIG. 1 is a schematic view of a structure of one embodiment of the apparatus section for forming the protective layer, which comprises the first film forming chamber for forming the protective layer 10 (the second film forming chamber of the protective layer 12) and a gas supply apparatus supplying gas into the first film forming chamber for forming the protective layer 10 (the second film forming chamber of the protective layer 12) of an in-line sputtering film forming apparatus of FIG. 4.

Figure 5:
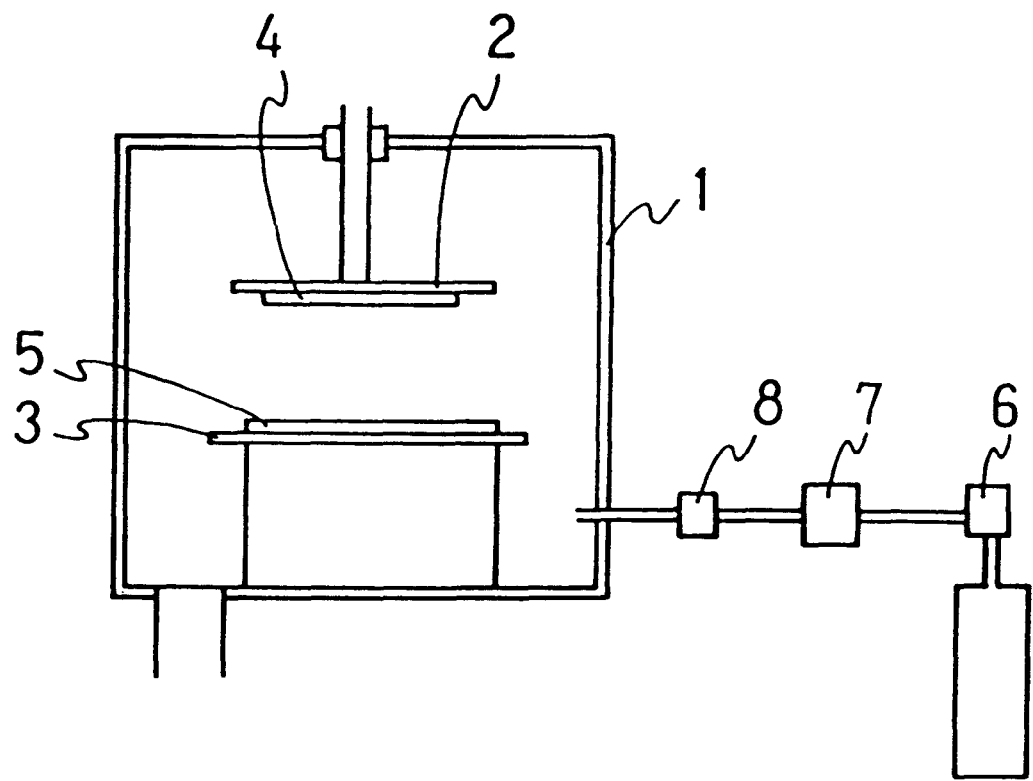
FIG. 5 is a schematic view showing a structure of the sputtering film forming apparatus of the prior art.

The same numbers given in FIG. 4 and FIG. 5 show the same or corresponding parts in each figure. Numeral 16 is a tank containing water 19, 17 is a heater for heating, 18 is Ar gas containing water, 30 is a gas introducing tube comprising a first introducing tube section 30a which introduces Ar gas from the gas bomb 6 into the tank 16 and a second introducing tube 30b which introduces gas from the gas bomb 6 immediately into the film forming chambers 10 and 12. An open part of the first introducing tube section 30a is soaked in water 19. Numeral 31 is a gas introducing tube by which Ar gas containing water 18 in the tank 16 into the film forming chambers 10 and 12. 7 and 7a are mass flow controllers each of which is equipped to the second introducing tube section 30b of the gas introducing tube 30 and the gas introducing tube 31, and 8 and 8a are pressure controlling valves. Herein, Ar gas in the gas bomb 6 is introduced into water 19 in the tank 16 through the first introducing tube section 30a of the gas introducing tube 30, thereby generating bubbles in the tank 16 and vaporizing the water 19 to form water vapor. The vaporized content of water is mixed with Ar gas to produce Ar gas containing water 18. Then, Ar gas containing water 18 is deposited onto the tank 16, and the deposited Ar gas containing 18 is supplied to the film forming chambers 10 and 12 through the gas introducing tube 31. In the first gas supply path using means of the second introducing tube section 30b of the gas introducing tube 30, the amount of Ar gas supplied from the gas bomb 6 to the film forming chambers 10 and 12 is controlled by means of the mass flow controller 7 and the pressure controlling valve 8. In the second gas supply path using the gas introducing tube 31, the amount of Ar gas containing water supplied into the film forming chambers 10 and 12 is controlled by the mass flow controller 7a and the pressure controlling valve 8a. In order for Ar gas containing water 18 not to form dew in the tube toward the film forming chamber, the heater for heating 17 preheats the entire gas supplying section 20 comprising the gas introducing tube 31, the mass flow controller 7a and the pressure controlling valve 8a, which are shown by the portion being edged by the dotted line. Moreover, the method for preventing the formation of dew is not limited to the above mentioned method, and alternative means may be used.

In the step of forming films of the protective layers (the first protective layer and the second protective layer) using such film forming apparatus, the predetermined amount of Ar gas is supplied from the second introducing tube section 30b of the gas introducing tube 30 into the film forming chambers 10 and 12, and the predetermined amount of Ar gas containing water 18 is supplied from the gas introducing tube 31. Consequently, the film forming chambers 10 and 12 are filled with Ar gas containing water at the desired concentration, so that hydroxyl groups (—OH) are surely introduced in the protective layers (the first protective layer and the second protective layer) formed on the substrates 5.

Therefore, the optical recording medium obtained through all the steps is excellent in the thermal and chemical stability, in mechanical strength, the adhesion to the recording thin film and the overwrite cycle property, because it has protective layers (the first protective layer and the second protective layer) containing hydroxyl groups (—OH).

Figure 2:
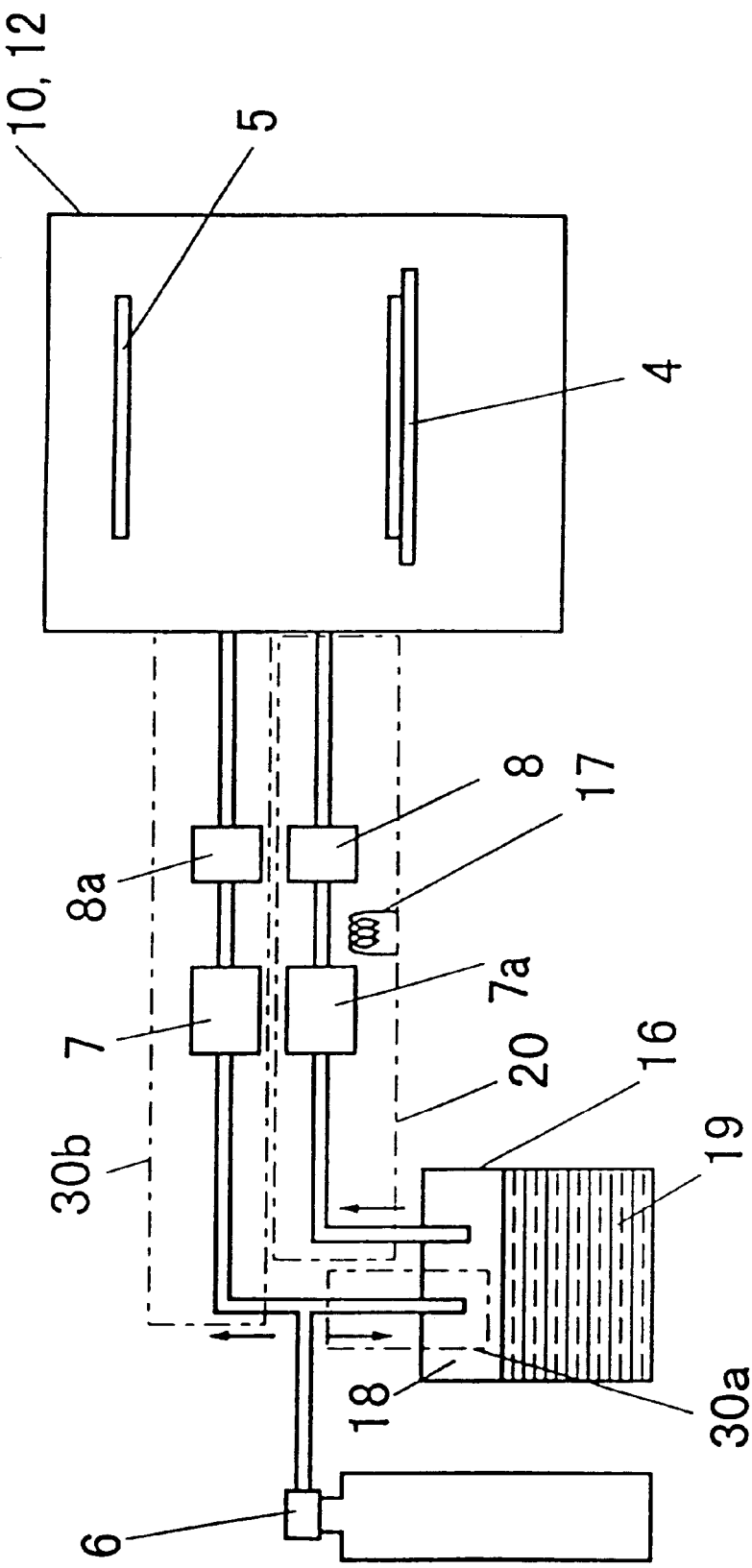
FIG. 2 is a schematic view showing a structure of another embodiment of the apparatus section for forming the protective layer, which comprises a film forming chamber for forming the protective layer and a gas supply apparatus supplying gas into the film forming chamber for forming the protective layer, in an in-line sputtering film forming apparatus used in the method for manufacturing the optical information recording medium of the present invention.
Figure 3:
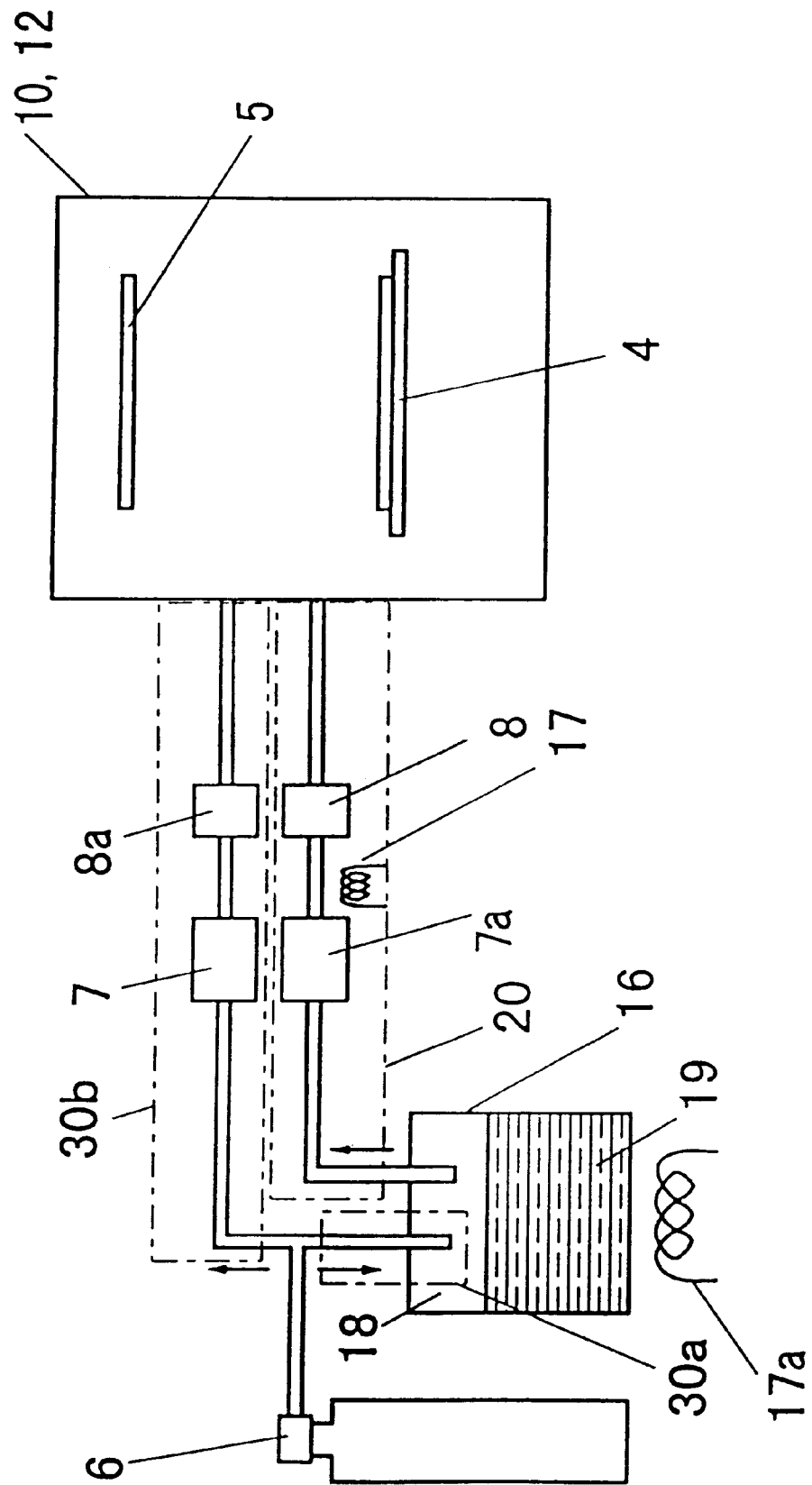
FIG. 3 is a schematic view showing a structure of a further embodiment of the apparatus section for forming the protective layer, which comprises a film forming chamber for forming the protective layer and a gas supply apparatus supplying gas into the film forming chamber for forming the protective layer, in an in-line sputtering film forming apparatus used in the method for manufacturing the optical information recording medium of the present invention.

Each of FIG. 2 and FIG. 3 is a schematic view showing a structure of another embodiment of the film forming apparatus section of the protective layer in the in-line sputtering film forming apparatus of FIG. 4. In FIGS. 2 and 3, the same numbers as those in FIG. 1 denote the same or corresponding sections. The apparatus of FIG. 2 is different from the apparatus of FIG. 1 in that an open part of the first introducing tube section 30a of the gas introducing tube 30 is placed in a space within the tank 16, and Ar gas is sprayed from the open part to the water 19, so that the water 19 is vaporized and Ar gas containing water 18 is generated. Moreover, the apparatus of FIG. 3 is different from the apparatus of FIG. 1 in that the open part of the first introducing tube section 30a of the gas introducing tube 30 is placed in a space within the tank 16, so that the tank 16 containing water 19 is directly heated by the heater 17a which is placed in the vicinity of the tank 16, the water 19 in the tank 16 is vaporized and Ar gas containing water 18 is generated.

Moreover, unlike the film forming apparatus shown in FIGS. 1 to 3, the following method may be used, where ice instead of water 19 is filled in the tank 16 and then a heated Ar gas is introduced in the tank 16 to spray therewith to the ice, thereby vaporizing water. In this case, however, the heater is required to be equipped in the vicinity of the first introducing tube section 30a of the gas introducing tube 30.

Figure 6:
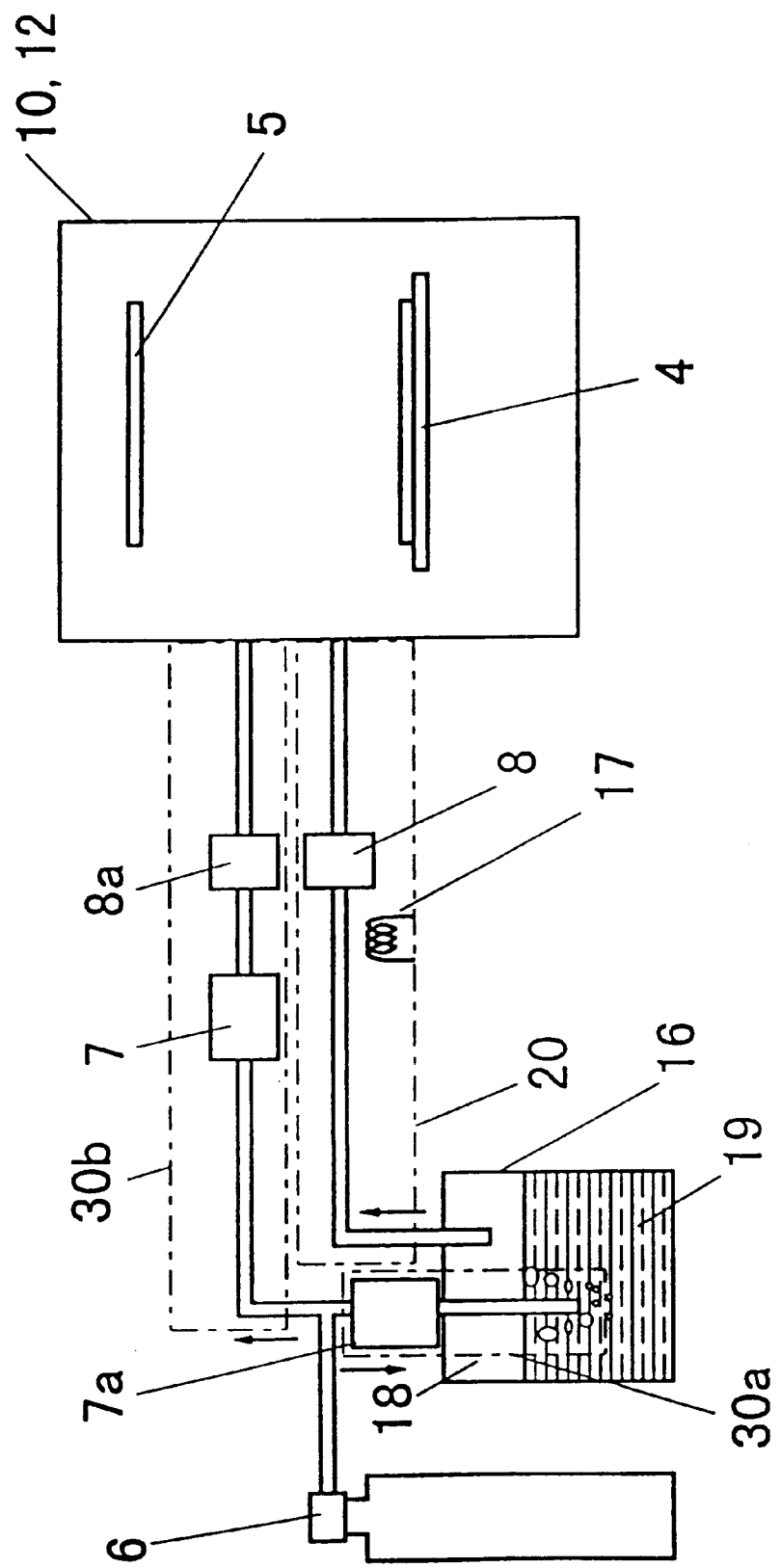
FIG. 6 is a schematic view showing a structure of a further embodiment of the apparatus section for forming the protective layer, which comprises a film forming chamber for forming the protective layer and a gas supply apparatus supplying gas into the film forming chamber for forming the protective layer, in an in-line sputtering film forming apparatus used in the method for manufacturing the optical information recording medium of the present invention.
Figure 7:
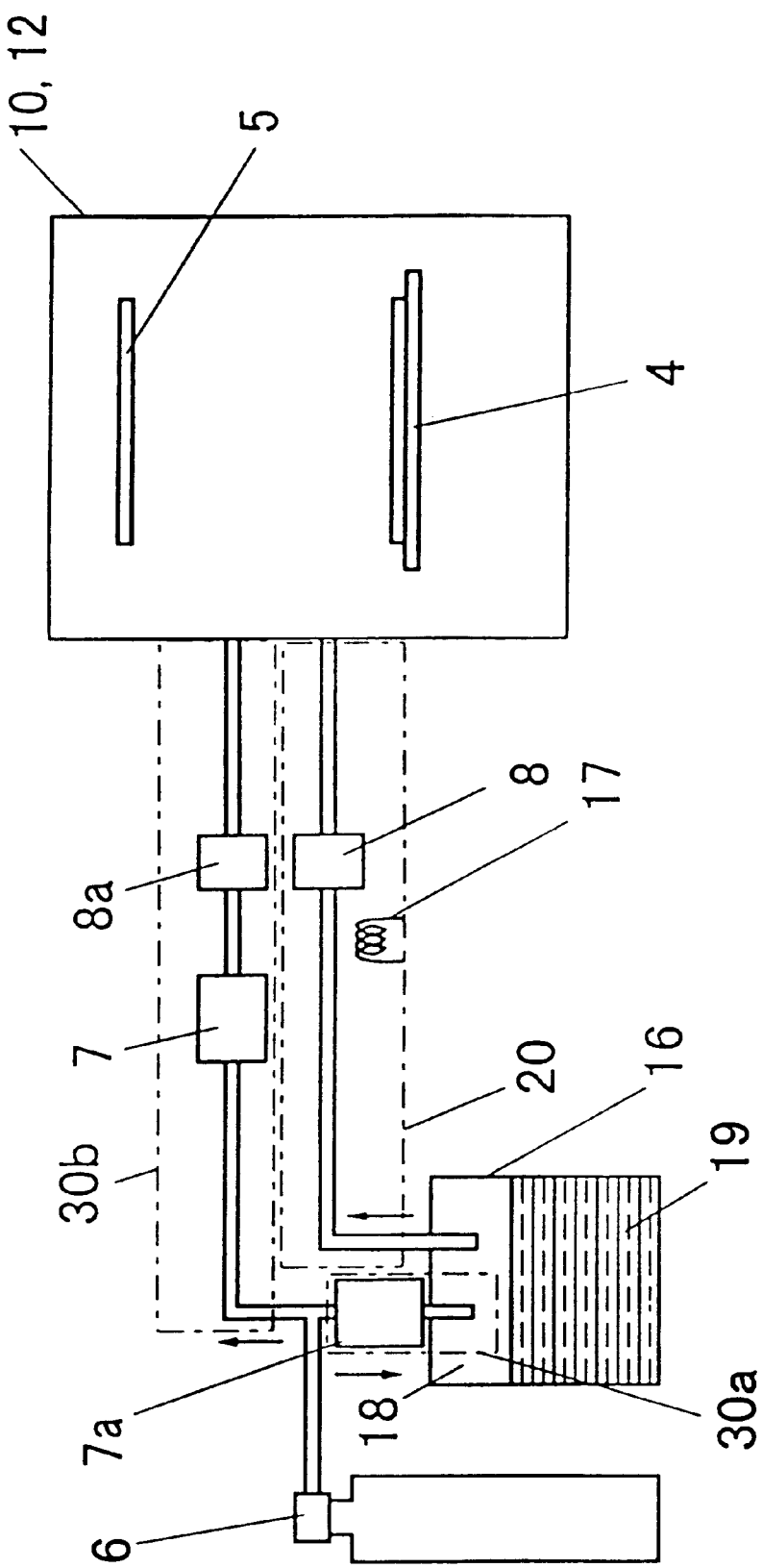
FIG. 7 is a schematic view showing a structure of a further embodiment of the apparatus section for forming the protective layer, which comprises a film forming chamber for forming the protective layer and a gas supply apparatus supplying gas into the film forming chamber for forming the protective layer, in an in-line sputtering film forming apparatus used in the method for manufacturing the optical information recording medium of the present invention.
Figure 8:
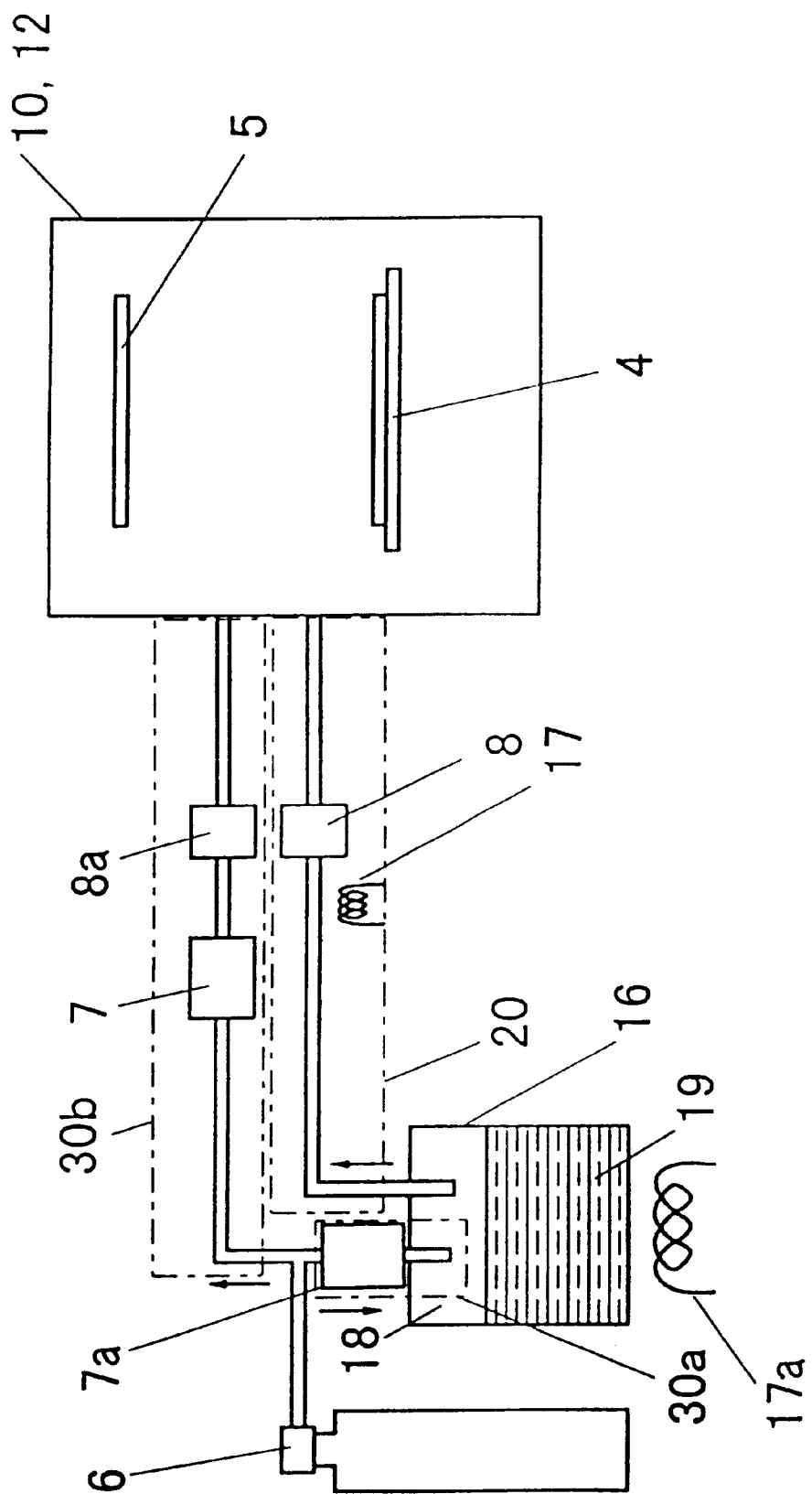
FIG. 8 is a schematic diagram showing a structure of a further embodiment of the apparatus section for forming the protective layer, which comprises a film forming chamber for forming the protective layer and a gas supply apparatus supplying gas into the film forming chamber for forming the protective layer, in an in-line sputtering film forming apparatus used in the method for manufacturing the optical information recording medium of the present invention.

Each of FIGS. 6, 7 and 8 are a schematic view showing a structure of another embodiment of the film forming apparatus for forming the protective layer in the in-line sputtering film forming apparatus of FIG. 4. In FIGS. 6, 7 and 8, the same numbers as those of FIG. 1 denote the same or corresponding sections of FIG. 1. The apparatus of FIG. 6 is different from the apparatus of FIG. 1 in that the mass flow controller 7a is placed in the first introducing tube section 30a of the gas introducing tube 30 and only the pressure controlling valve 8 is placed in the gas introducing tube 20. Moreover, the apparatus of FIG. 7 is different from the apparatus of FIG. 2 in that the mass flow controller 7a is placed in the first introducing tube section 30a of the gas introducing tube 30, only the pressure controlling valve 8 is placed in the gas introducing tube 20. In addition, the apparatus of FIG. 8 is different from the apparatus of FIG. 3 in that the mass flow controller 7a is placed in the first introducing tube section 30a of the gas introducing tube 30, only the pressure controlling valve 8 is placed in the gas introducing tube 20.

First Embodiment

The following experiment was conducted by the use of the above mentioned in-line sputtering film forming apparatus of FIG. 4 in which the film forming apparatus comprises the first film forming chamber of the protective layer 10 and the film forming apparatus having the second film forming chamber of the protective layer 12 of FIG. 1.

In order to obtain the various kinds of optical discs having various film qualities (properties) of protective layers, optical discs were manufactured under various conditions, that is, the $H_2O$ concentration in the gas in the film forming chamber is varied by varying the flow rate of Ar gas containing no water (normal Ar gas) into the film forming chamber, and the flow rate of Ar gas containing water into film forming chamber, in the steps of forming the first and second protective layers in the method for manufacturing each optical disc. Herein, the $H_2O$ concentration of the gas in the film forming chamber was measured by the use of a quadrupole mass spectrometer. The thickness of each layer of the optical disc was: the first protective layer was approximately 150 nm; the recording thin film was approximately 20 nm; the second protective layer was approximately 40 nm; and the reflecting layer was approximately 100 nm. Each layer was formed under the conditions as follows. The recording thin film was formed by using Ge—Te—Sb alloy as a material for a film, under the vacuum degree of 2 mTorr, by the DC magnetron sputtering method, and introducing a normal Ar gas at the flow rate of 10 sccm. The reflecting layer was formed by using Al alloy as a material for a film, under the vacuum degree of 2 mTorr, by the DC magnetron sputtering method, and by introducing a normal Ar gas at the flow rate of 10 sccm. The first and second protective layers were formed by using $ZnS$—$SiO_2$ as a material for a film, under the vacuum degree of 1 mTorr, by the RF magnetron sputtering method, and by introducing a normal Ar gas at a flow rate of 10 sccm and Ar gas containing water at a flow rate of 0–1.0 sccm. The recording and erasing properties of the resultant disc were measured at the rotating ratio of 2026 rpm by the use of an optical disc drive including an optical pick-up having a semiconductor laser wave length of 780 nm, and numerical aperture (NA) of objective lens of 0.5. When the liner speed at the outer most circumference was 12 m/s, a signal of the recording frequency of 8.87 MHz was recorded at the luminescent time with the pulse width of 32 ns, and then the C/N ratio was measured by a spectrum analyzer. The resultant C/N ratio was not less than 50 dB. Moreover, the erasing ratio was measured as follows: a signal of 8.87 MHz was recorded, a signal of 3.32 MHz was overwritten, and the erasing ratio was measured by subtracting the spectral recorded at the rate of 3.32 MHz from the spectral overwritten at the rate of 8.87 MHz by the use of spectrum analyzer. The resultant erasing ratio was 25 dB.

Next, the experiment of the overwrite cycle property of each optical disc was conducted. An experiment of an overwrite cycle was conducted by the use of the random signal which was "2–7" demodulated by PPM (pit position modulation) recording. The shortest mark pitch was made to be 1.35 $\mu$m. The results were shown in Table 1. The cycle life was defined as follows: that is, the above mentioned random signal was continuously overwritten on the same track continuously at a plurality of cycles and the signal was reproduced and BER (bit error rate) was measured. The BER was gradually deteriorated along with the cycle. A number of cycles when the more than $1 \times 10^{-5}$ was defined to be the cycle life time of an optical disc. The results were shown in Table 1.

TABLE 1

| Ar gas (sccm) | Ar gas containing water (sccm) | $H_2O$ concentration to the gas in the film forming chamber (%) | Cycle (10000 times) |
|---|---|---|---|
| 10 | 10 | 20 | 60 |
| 10 | 8 | 16 | 80 |
| 10 | 5 | 10 | 100 |
| 10 | 3 | 6 | 100 |
| 10 | 1 | 2 | 100 |
| 10 | 0.5 | 1 | 100 |
| 10 | 0.3 | 0.6 | 100 |
| 10 | 0.1 | 0.2 | 100 |
| 10 | 0.05 | 0.1 | 100 |
| 10 | 0.03 | 0.06 | 80 |
| 10 | 0.01 | 0.02 | 50 |
| 10 | 0 | 0 | 40 |

As is apparent from Table 1, in a case where the optical disc was obtained in a film forming atmosphere in which Ar gas containing water was supplied to the film forming chamber and glow discharge thereof to generate plasma, the overwritable cycle life time (the number of cycles:

500000–1000000 times) was considerably improved as compared with the overwritable cycle life time of the optical disc obtained in a film forming atmosphere in which Ar gas containing no water was supplied to the film forming chamber and glow discharged thereof to generate plasma (the number of cycles: 40000 times).

In particular, it is preferable that the concentration of $H_2O$ in the gas in the film forming chamber is in the range of 0.1 to 10 vol. %, since the overwritable cycle time was stable and it was 1000000.

In addition, in a case where Ne, Ar, Kr and Xe or the like were used as a gas, the same results as the above mentioned experiment was confirmed to be obtained.

Moreover, in a case where the film forming apparatus shown in FIGS. 2 and 3 were used as a film forming apparatus comprising the first film forming chamber of the protective layer 10 and the second film forming chamber of the protective layer 12, the same results as the above mentioned experiment were confirmed to be obtained.

Second Embodiment

The following experiment was conducted by the use of the above mentioned in-line sputtering film forming apparatus of FIG. 4 in which the film forming apparatus comprises the first film forming chamber of the protective layer 10 and the film forming apparatus having the second film forming chamber of the protective layer 12 of FIG. 1.

In order to obtain the various kinds of optical discs having various film qualities (properties) of protective layers, optical discs were manufactured under various conditions, that is, the $H_2O$ concentration in the gas in the film forming chamber is varied by varying the flow rate of Ar gas containing no water (normal Ar gas) into the film forming chamber, and the flow rate of Ar gas containing water into the film forming chamber before forming the first and second protective layer of the method for manufacturing each optical disc. Herein, at the time of forming the first and second protective layers, only a normal Ar gas is supplied to the film forming chamber. The thickness of each layer of the optical disc was: the first protective layer was approximately 150 nm; the recording thin film was approximately 20 nm; the second protective layer was approximately 40 nm; and the reflecting layer was approximately 100 nm. Each layer was formed under the following conditions respectively. The recording thin film was formed by using Ge—Te—Sb alloy as a material for a film, under the vacuum degree of 2 mTorr, by the DC magnetron sputtering method, and introducing a normal gas at a flow rate of 10 sccm. The reflecting layer was formed by using Al alloy as a material for a film, under the vacuum degree of 2 mTorr, by the DC magnetron sputtering method, and introducing a normal gas at a flow rate of 10 sccm. The first and second protective layers were formed by using ZnS—SiO2 as a material for a film, under the vacuum degree of 1 mTorr, by the RF magnetron sputtering method, and introducing normal Ar gas at a flow rate 10 sccm, and introducing Ar gas containing water at a flow rate of 0–1.0 sccm. The recording and erasing method of the resultant disc was measured by the same method as the first embodiment. The erasing ratio was 25 dB.

Next, the property of the overwrite cycle was evaluated in the same manner as the first embodiment.

TABLE 2

| Ar gas (sccm) | Ar gas containing water (sccm) | $H_2O$ concentration to the gas in the film forming chamber (%) | Cycle (10000 times) |
|---|---|---|---|
| 10 | 10 | 20 | 50 |
| 10 | 8 | 16 | 70 |
| 10 | 5 | 10 | 100 |
| 10 | 3 | 6 | 100 |
| 10 | 1 | 2 | 100 |
| 10 | 0.5 | 1 | 100 |
| 10 | 0.3 | 0.6 | 100 |
| 10 | 0.1 | 0.2 | 100 |
| 10 | 0.05 | 0.1 | 100 |
| 10 | 0.03 | 0.06 | 80 |
| 10 | 0.01 | 0.02 | 40 |
| 10 | 0 | 0 | 40 |

As is apparent from Table 2, in a case where the optical disc was obtained in a film forming atmosphere in which Ar gas containing water was supplied to the film forming chamber and glow discharge thereof to generate plasma, the overwrite cycle life time (the number of cycles: 500000–1000000 times) was considerably improved as compared with the overwrite cycle life time (the number of cycles: 400000 times) of the optical disc obtained in a film forming atmosphere in which Ar gas containing no water was supplied to the film forming chamber and glow discharged thereof to generate plasma.

In particular, it is preferable that the concentration of $H_2O$ in the gas in the film forming chamber is in the range of 0.1 to 10 vol. %, since the overwrite cycle became stable and the cycle time was 1000000.

In addition, in a case where Ne, Ar, Kr and Xe or the like were used as a gas, the same results as the above mentioned experiment was confirmed to be obtained.

Moreover, in a case where the film forming apparatus shown in FIGS. 2 and 3 were used as a film forming apparatus comprising the first film forming chamber of the protective layer 10 and the second film forming chamber of the protective layer 12, the same results as the above mentioned experiment were confirmed to be obtained.

Finally, it is understood that the invention may be embodied in other specific forms without departing from the spirit or essential characteristics thereof. The embodiments disclosed in this application are to be considered in all respects as illustrative and not restrictive, so that the scope of the invention being indicated by the appended claims rather than by the foregoing description, and all changes which come within the meaning and range of equivalency of the claims are intended to be embraced therein.

What is claimed is:

1. A method for manufacturing an optical information recording medium comprising a recording layer comprising materials which change reversibly between optically identifiable states when irradiated by a laser beam on a substrate and a protective layer formed on at least one of main surfaces of said recording layer, said method comprising the steps of:

placing a substrate and a member comprising a material for a film opposing each other in a vacuum film forming chamber;

forming a plasma by glow discharging a gas between said substrate and said member comprising a material for a film; and supplying a gas mixture containing water to said film forming chamber in any step selected from the group consisting of before forming the film protective layer and during forming the film protective layer, wherein said gas mixture contains water at a concentration of not less than about 0.1 vol. % nor more than about 10 vol. %, wherein said materials for a film are attached or deposited on said substrate by using said plasma as an energy source.

2. The method for manufacturing an optical information recording medium according to claim 1, wherein the protective layer is formed by at least one dielectric material selected from the group consisting of $Al_2O_3$, $SiO_x$, $Ta_2O_5$, $MoO_3$, $WO_3$, ZnS, $ZrO_2$, $AlN_x$, BN, $SiN_x$, TiN, ZrN, $PbF_2$, $MgF_2$, and a mixture thereof.

3. The method for manufacturing an optical information recording medium according to claim 1, wherein the gas mixture containing water comprises at least one gas selected from the group consisting of Ne, Ar, Kr, Xe, and mixture thereof.

4. The method for manufacturing an optical information recording medium according to claim 1, wherein said method for forming films is a sputtering method using a member comprising a material for a film as a sputter target.

5. The method for manufacturing an optical information recording medium according to claim 1, wherein a gas supply means comprises a gas bomb filled with gas, a tank containing water, a first gas introducing tube having a first introducing tube section with which gas is introduced into said tank from said gas bomb and a second introducing section with which gas is introduced immediately into said film forming chamber from said gas bomb, a second gas introducing tube with which the gas mixture of the vaporized content of said water and said gas is introduced into said film forming chamber from said tank, and a gas flow controlling means equipped respectively to said second introducing tube section of said first gas introducing tube and to at least one section selected from the group consisting of said first introducing tube section of said first gas introducing tube and said second gas introducing tube.

6. The method for manufacturing an optical information recording medium according to claim 5, wherein an open part of the first introducing tube section of the first gas introducing tube is soaked in water, and gas released from said open part makes water in said tank bubble, thereby vaporizing said water.

7. The method for manufacturing an optical information recording medium according to claim 5, wherein an open part of the first introducing tube section of the first gas introducing tube is placed in a space of the tank and gas released from said open part is sprayed to water in the tank, thereby vaporizing said water.

8. The method for manufacturing an optical information recording medium according to claim 5, wherein a heater is placed in the vicinity of the tank and said heater heats said tank, thereby vaporized water in said tank.

9. The method for manufacturing an optical information recording medium according to claim 5, wherein a heater for heating the second gas introducing tube and the gas flow controlling means equipped to the second gas introducing tube is provided.

* * * * *